United States Patent
Yu et al.

(10) Patent No.: US 6,804,359 B1
(45) Date of Patent: Oct. 12, 2004

(54) SIGNAL PROCESSOR FOR REDUCING UNDESIRABLE SIGNAL CONTENT

(75) Inventors: Li Yu, Ottawa (CA); Martin Snelgrove, Ottawa (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 09/127,844

(22) Filed: Aug. 3, 1998

(30) Foreign Application Priority Data

Aug. 1, 1997 (CA) .............................................. 2209509

(51) Int. Cl.[7] .......................... H03B 29/00; H04B 15/00
(52) U.S. Cl. ............................... 381/71.11; 381/71.12; 381/94.2; 381/94.3
(58) Field of Search ....................... 381/94.7, 55, 71.11, 381/71.12

(56) References Cited

U.S. PATENT DOCUMENTS

| | | | | |
|---|---|---|---|---|
| 4,709,391 A | * | 11/1987 | Kaizer et al. ................. | 381/98 |
| 5,416,845 A | * | 5/1995 | Qun ........................ | 381/71.12 |
| 5,553,014 A | * | 9/1996 | De Leon et al. ............ | 708/322 |
| 5,694,476 A | * | 12/1997 | Klippel ........................ | 391/96 |
| 5,815,585 A | * | 9/1998 | Klippel ........................ | 381/96 |
| 5,825,898 A | * | 10/1998 | Marash ........................ | 381/92 |
| 5,978,489 A | * | 11/1999 | Wan ........................ | 381/71.11 |

* cited by examiner

*Primary Examiner*—F. W. Isen
*Assistant Examiner*—Elizabeth McChesney
(74) *Attorney, Agent, or Firm*—McDermott Will & Emery LLP

(57) ABSTRACT

A signal processor for reducing undesirable signal content reduces the undesirable signal content by exaggerating the undesirable signal content and then using this exaggerated undesirable signal and adaptive filter means to estimate the undesirable content in the signal and then substantially removing it from the signal. The signal processor includes a signal mapping means for exaggerating the undesirable signal content; and an adaptive filter means for reducing the undesirable signal content using the exaggerated undesirable signal content.

16 Claims, 20 Drawing Sheets

DOUBLE SAMPLING CIRCUIT MODEL

MISMATCH CANCELLATION MODEL

N-path filters/channels

COMPLEX FILTER SIGNAL MAPPING

POLYPHASE FILTER SIGNAL MAPPING

COMPLEX FILTER SIGNAL MAPPING

POLYPHASE FILTER SIGNAL MAPPING

PREFERED MAPPING CIRCUIT

ADAPTIVE FILTER REALIZED AS A ZERO ORDER
NOISE CANCELLER FOR THE I,Q SYSTEM

COMPLEX FILTER SIGNAL MAPPING $\frac{fs}{4}$ NOTCH FILTER

SIGNAL PROCESSOR FOR REDUCING UNDESIRABLE SIGNAL CONTENT

FIELD OF THE INVENTION

The present invention relates broadly to signal processing. More specifically, the invention relates to signal mapping and adaptive filtering to reduce undesirable signal content.

BACKGROUND OF THE INVENTION

Electronic systems often resolve a single signal into a pair of related signals. This representation allows better signal processing since often information about the single signal can be derived more readily from the pair of related signals.

An example of a pair of signals related to a single signal are in phase (I) and quadrature (Q) signals. In phase and quadrature signals are two analog signals derived by mathematical correlation with two periodic signals that differ by a phase difference of 90 degrees.

Another example of a pair of signals related to a single signal are even and odd signals. Produced by double sampling, even and odd signals are two digital signals that only differ by having been sampled at times different by half a clock period.

Systems that involve these pairs of signals rely heavily on the relationship between the constituent signals of the pair. Due to the imperfections in the circuitry, the expected difference in the pair of signals is usually not the difference that is actually realized.

For example, often I,Q systems suffer from unwanted image spectra due to imperfections in the circuitry used. A first stage of an I,Q receiver often comprises an I,Q mixer, as shown in FIG. 1. The mixer comprises a multiplication of the input signal by the cosine and sine of a desired frequency. The sine is usually generated by introducing a 90 degree phase shift to the cosine, as shown in FIG. 1(a). If the phase shift is not exactly 90 degrees or if the multipliers have different gains, leakage occurs between the I and Q signals. Therefore, the desired relationship between the I and Q signals is not exactly realized. I,Q systems often have analog to digital converters following the I,Q conversion, as seen in FIG. 1 (b), and this also sometimes results in possible gain mismatch. These systems may also use complex filters to process the I and Q signals to obtain desired spectral information, as seen in FIG. 1(c). These filters may be implemented as set of four real filters. If implemented in the analog domain, as shown in FIG. 1(c), mismatch in the filter transfer functions will also cause spectral leakage.

The spectral leakage is shown in FIG. 2. The input signal usually has unwanted frequency components above or below the first mixing frequency, $\omega_1$, spaced equally with the desired signal. FIG. 2(a) shows the result of a frequency mix with a real signal, FIG. 2(b) shows the result of a complex frequency mix. If the complex term is perfect then a simple frequency translation occurs. If the complex term is imperfect, as is the case in realizable circuits, then spectral leakage occurs. This leakage is a serious problem in I,Q receiver architectures. The spectral leakage degrades the signal to noise ratio and hence degrades performance.

There are many other ways to generate I and Q signals in the art. Some implementations resolve a signal into two components, process them and then recombine the signals. In these implementations there may be imperfections in the resolved signals which will affect the recombination integrity.

Further, the resolved signals may or may not be orthogonal.

Another example of undesirable signal content occurs in N-path filters. A subset of the class of circuits called N-path filters, with N being equal to two, is called double sampled circuits. A two-path circuit and its associated clock phases are illustrated in FIGS. 3 and 4, respectively. In this circuit, the input signal is sampled every half clock period, $T_s/2$, and appears at the output with a half-clock period delay. Therefore, the effective sampling frequency in this two-path sample and hold circuit is twice the clock frequency. Thus, by using a pair of related signals a factor of two improvement in the speed of the double sampled circuit is achieved without increasing the clock rate or requiring a fast op-amp.

However, double sampled circuits suffer from image aliasing due to capacitor mismatch and uneven clock phases. The image caused in sampled analog circuits using the technique known as double sampling, is effectively the same effect as in the I,Q system previously described. In the double sampled system the error is caused not only by a physical mismatch, but also by temporal mismatch in the two phases of the clock. This is illustrated in FIG. 4. In a single sampling system, a sample is taken on each rising or falling edge. In a double sampling system, both clock edges are used. Since $T_2$ and $T_3$ of FIG. 4 are not equal, a sampling error occurs at every second sample. This is effectively a modulation at the clock frequency resulting in undesirable image spectra.

Images are also caused by sampled analog circuits using the general sampling technique used in N-path filters. The image in the case of N-path filters is created by temporal mismatch in N phases of a clock, as well as any physical mismatches in the N individual paths. The clock signals for N phases are illustrated in FIG. 5.

Conventional approaches to this problem have been accurate device matching or device trimming techniques to address the physical matching requirements and attempt to cancel the imperfections.

Alternatively, receiver architectures that do not use multiple matched paths have been employed.

An improved signal processor which reduces the undesirable signal content due to circuitry imperfections is desirable.

SUMMARY OF THE INVENTION

An object of the invention is to provide an improved signal processor for reducing undesirable signal content due to circuitry imperfections.

In accordance with one aspect of the present invention, there is provided a signal processor for reducing undesirable signal content in a signal produced by an analog circuit having imperfections. The signal processor includes a signal mapping means for exaggerating the undesirable signal content; and an adaptive filter means for reducing the undesirable signal content using the exaggerated undesirable signal content.

Other advantages, objects and features of the present invention will be readily apparent to those skilled in the art from a review of the following detailed description of preferred embodiments in conjunction with the accompanying drawings and claims.

BRIEF DESCRIPTION OF THE DRAWINGS

These and other features of the invention will become more apparent from the following description in which reference is made to the appended drawings in which.

DETAILED DESCRIPTION OF PREFERRED EMBODIMENTS OF THE INVENTION

By way of overview, one aspect of the present invention is to provide an improved signal processing system which reduces the undesired signal content due to circuitry imperfections. This invention reduces the undesirable signal content by exaggerating the undesirable signal content and then using this exaggerated undesirable signal and adaptive filter means to estimate the undesirable content in the signal and then substantially removing it from the signal. A "signal" as described herein can be a single electrical signal or a combination of one or more electrical signals.

Figure 6:
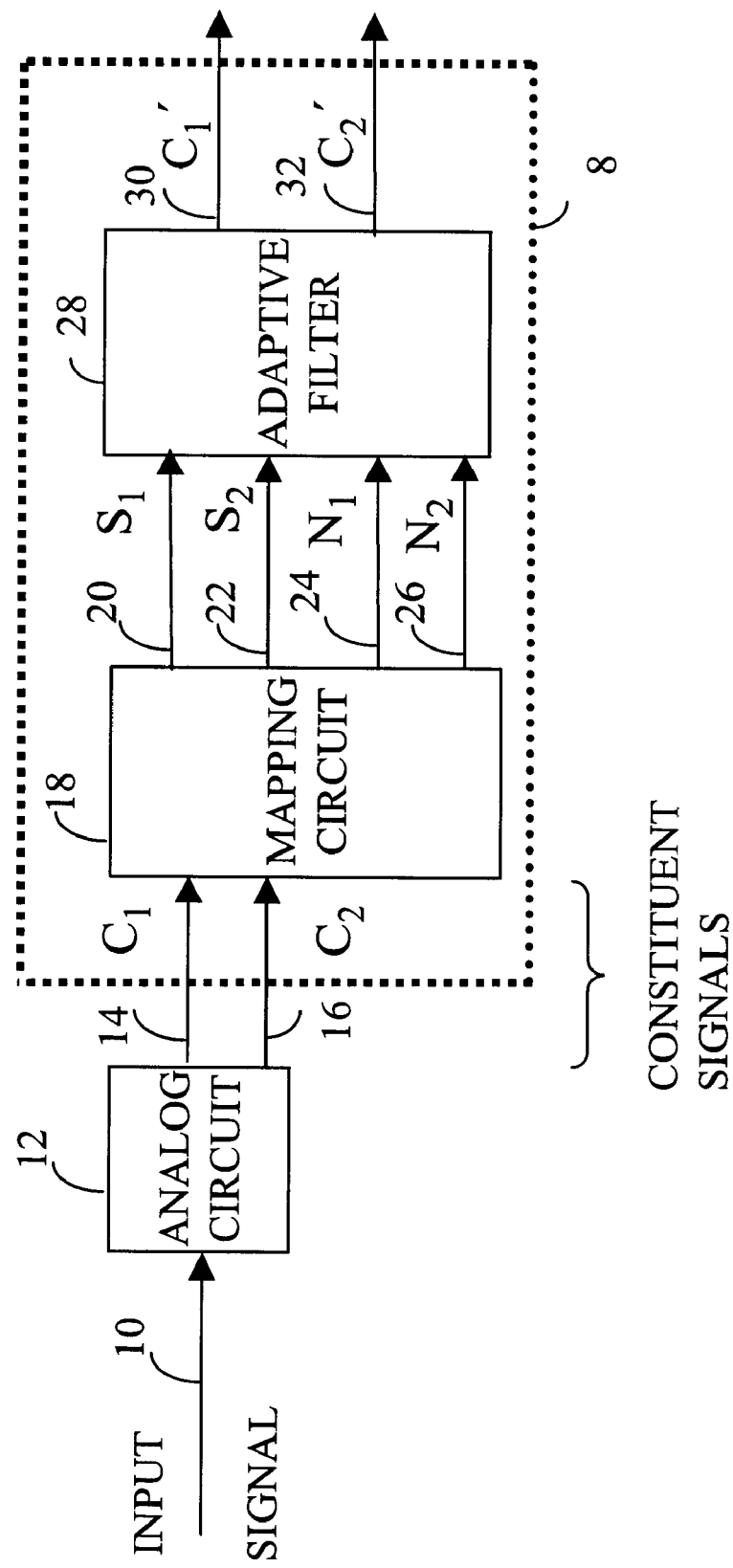
FIG. 6 illustrates a signal processor which reduces the undesirable signal content due to circuitry imperfections.

FIG. 6 broadly illustrates a signal processor 8 to reduce the undesirable signal content in a signal produced by an analog circuit 12 having imperfections. An input signal 10 is received by the analog circuit 12. The analog circuit 12 resolves the input signal 10 into a constituent signal pair, namely signals $C_1$ 14 and $C_2$ 16. Due to the imperfections in the analog circuit 12, relationship between the constituent signals 14,16 is not as desired. The undesirable aspects manifest themselves, in the frequency domain, as unwanted spectral images. These spectral images degrade the representation of the original input signal 10. Therefore the effect of the spectral images resulting from the imperfections in the analog circuit 12 can be considered noise.

Adaptive filters are routinely used to cancel inband noise in a receive channel. Echo cancellers and noise cancellers are typical examples. An aspect of the present invention extends the idea of noise to include out of band interferers aliased and or mixed into the bank of interest by circuitry imperfections. Used in this application, the adaptive filter is responsive to a signal with a small amount of noise and a signal with a large amount of noise. The adaptive filter estimates the noise content of the signal and removes it from the signal, thus producing an output signal that is much less noisy than the input signal.

An adaptive filter 28 is used to reduce the undesirable signal content caused by imperfections in the analog circuit 12. The adaptive filter 28 must be responsive to a signal with a small amount of noise and a signal with a large amount of noise. However, the present invention is concerned with a pair of related signals, namely $C_1$ 14 and $C_2$ 16, which contain undesirable signal content. The adaptive filter 28 is therefore responsive to pairs of signals. One pair of signals, $S_1$ 20 and $S_2$ 22, are signals with a small amount of noise. The other pair of signals, $N_1$ 24 and $N_2$ 26, are signals with a large amount of noise. Given the input of signals $S_1$ 20, $S_2$ 22, $N_1$ 24 and $N_2$ 26 the adaptive filter 28 produces an output pair of signals, namely $C'_1$ 30 and $C'_2$ 32, which include a signal with the undesired signal content from the analog circuit 12 reduced.

The required input signals $S_1$ 20, $S_2$ 22, $N_1$ 24 and $N_2$ 26 for the adaptive filter 28 are produced by a mapping circuit 18. The mapping circuit 18 is responsive to the output signal pair from the analog circuit 12, namely signals $C_1$ 14 and $C_2$ 16. The mapping circuit 18 maps signals $C_1$ 14 and $C_2$ 16 to produce signals $S_1$ 20, $S_2$ 22, $N_1$ 24 and $N_2$ 26. Therefore, the mapping circuit 18 is responsive to the signal with imperfections produces at least one signal with exaggerated undesirable signal content for use by the adaptive filter 28.

Thus, there is provided a signal processor 8 for removing undesirable signal content in a signal, namely $C_1$ 14 and $C_2$ 16 produced by an analog circuit 12 having imperfections, the signal processor 8 comprising: a signal mapping means 18 for exaggerating the undesirable signal content; and an adaptive filter means 28 for reducing the undesirable signal content using the exaggerated undesirable signal content.

Figure 7:
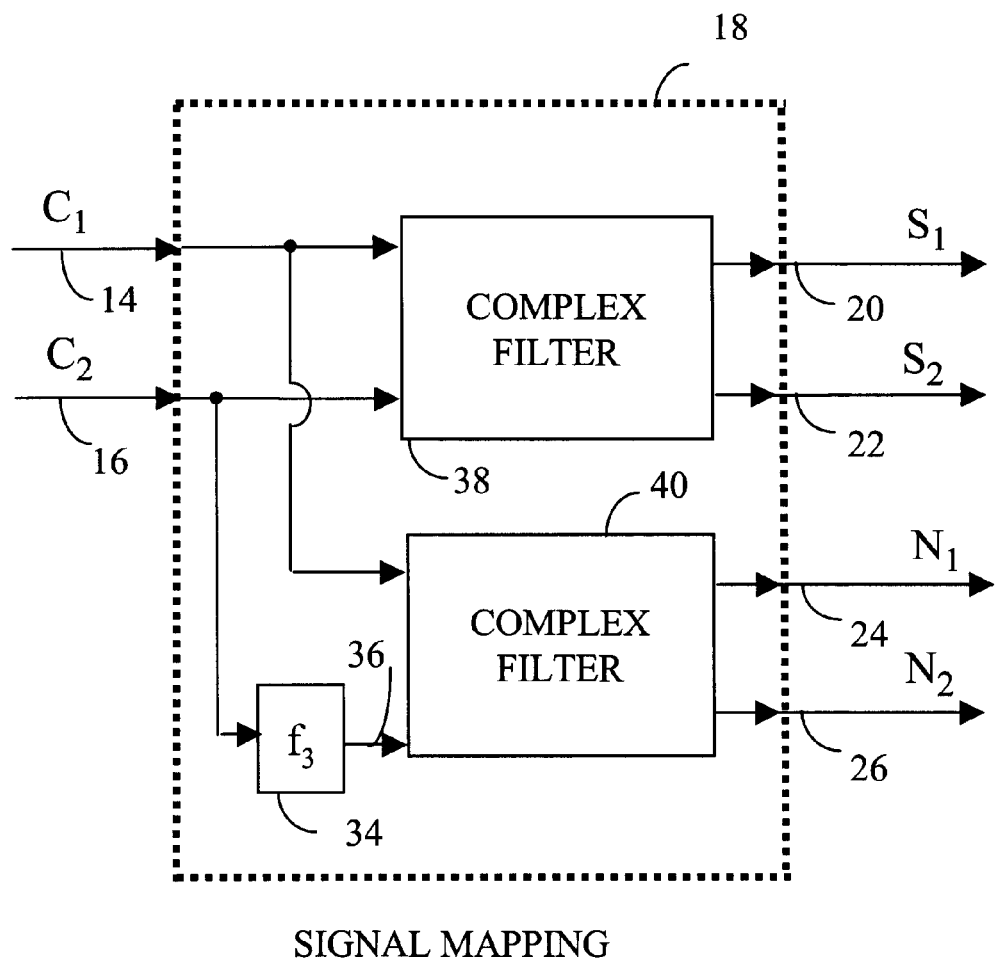
FIG. 7 illustrates the signal mapping circuit suitable for use in an I,Q system.

The first component in the signal processor 8 is the signal mapping circuit 18. An embodiment of the signal mapping circuit 18, which is useful for the undesirable signal content for an I,Q system, is shown in FIG. 7. The signals $C_1$ 14 and $C_2$ 16 which contain the undesired signal content are fed into a complex filter 38. A complex filter is a filter that has a transfer function with complex coefficients. The complex filter 38 maps signals $C_1$ 14 and $C_2$ 16 to signals $S_1$ 20 and $S_2$ 22. The mapping accomplished by the complex filter 38 ensures that signals $S_1$ 20 and $S_2$ 22 are suitable for input to the adaptive filter 28 as the signal with a small amount of noise. Signals $C_1$ 14 and $C_2$ 16 are also mapped by a second complex filter 40 and function block 34 to produce signals $N_1$ 24 and $N_2$ 26. The mapped signals $N_1$ 24 and $N_2$ 26 are suitable for input to the adaptive filter 28 are the signal with a large amount of noise. Function block 34 exaggerates the undesirable signal content of signals $C_1$ 14 and $C_2$ 16. The transfer function of function block 34, $f_3$, is a linear function of input signal $C_2$ 16, and function block 34 produces output signal 36 for input to complex filter 40.

Filters 38 and 40 often serve to remove direct current (DC) from signals $C_1$ 14 and $C_2$ 16, which is desirable because DC can cause the adaptive filter 28 to not function as desired. The filters 38 and 40 can also be used to remove irrelevant signal components contained in signals $C_1$ 14 and $C_2$ 16. These irrelevant signal components tend to reduce the effectiveness of the adaptive filter 28.

Thus, the mapping for the I,Q system shown in FIG. 7 is responsive to the imperfect signals $C_1$ 14 and $C_2$ 16 from analog circuit 18 and produces signals $S_1$ 20, $S_2$ 22 and signals $N_1$ 24, $N_2$ 26 suitable for input signals for the adaptive filter 28 with a small and large amount of undesirable signal content, respectively.

Figure 8:
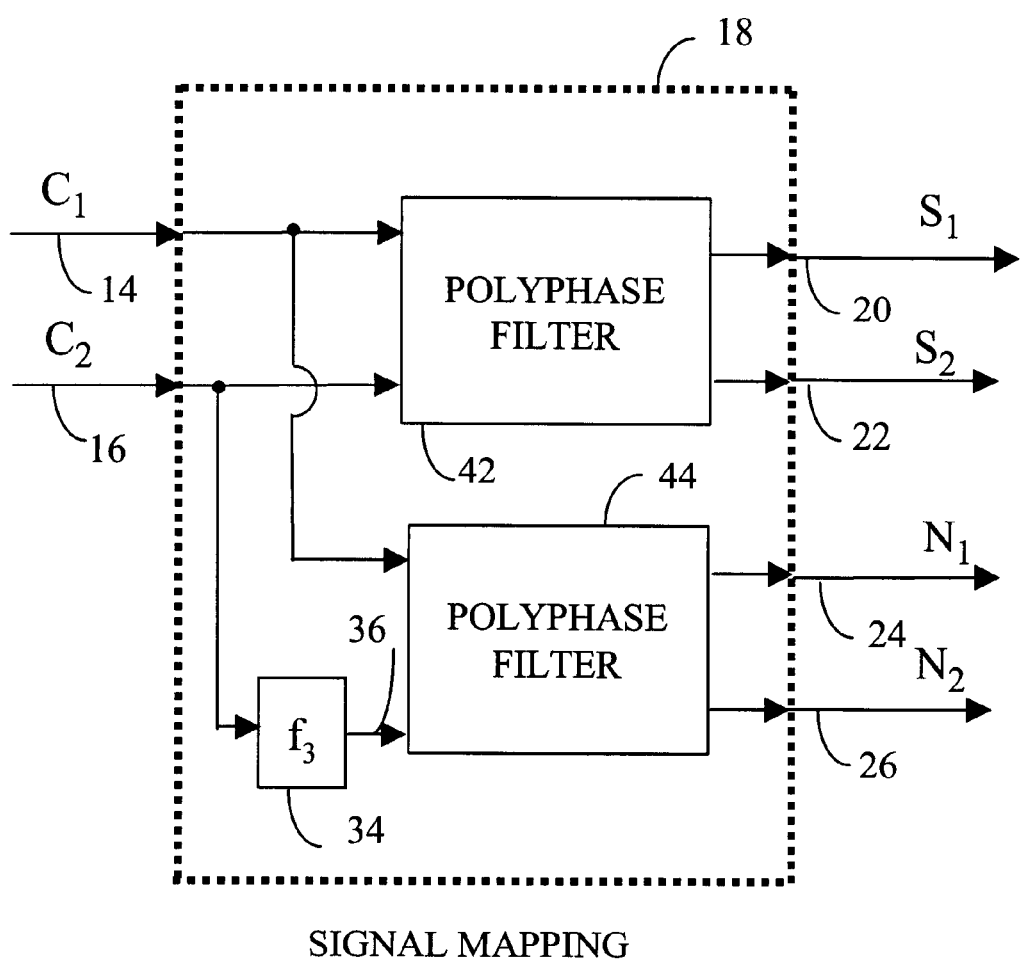
FIG. 8 illustrates the signal mapping circuit suitable for use in a double sampled system.

FIG. 8 illustrates another embodiment for the signal mapping circuit 18 which is useful for the double sampled system. This embodiment is similar to that illustrated in FIG. 7 for the I,Q system. The difference for the double sampled system illustrated in FIG. 8 is that the complex filters 38, 40 are replaced by polyphase filters so that the correct signals $S_1$ 20, $S_2$ 22 and signals $N_1$ 24, $N_2$ 26 are provided for the adaptive filter 28.

Thus, the mapping for the double sampled system shown in FIG. 8 is responsive to the imperfect signals $C_1$ 14 and $C_2$ 16 from analog circuit 18 and produces signals $S_1$ 20, $S_2$ 22 and signals $N_1$ 24, $N_2$ 26 suitable for input signals for the adaptive filter 28 with a small and large amount of undesirable signal content, respectively.

Figure 9:
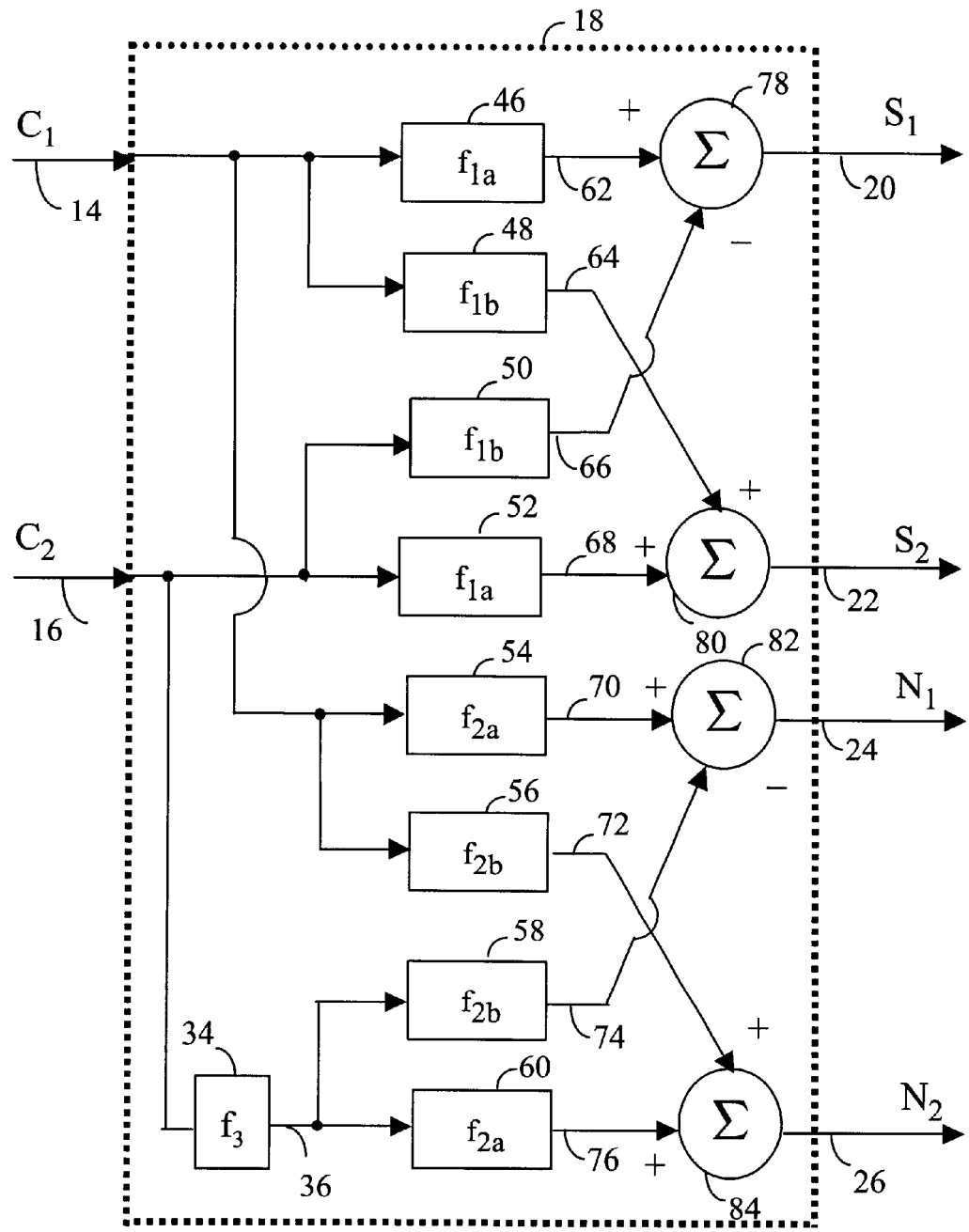
FIG. 9 illustrates an embodiment of the general mapping for the complex filter.

FIG. 9 illustrates the components comprising the complex filters 38, 40 in the I,Q mapping circuit 18 illustrated in FIG. 7. The complex filters 38, 40 are each realized by a combination of four real filters. The complex filter 38 is realized, in an embodiment, by four real filters 46, 48, 50, 52. Real filters 46 and 52 have the same transfer function $f_{1a}$. Real filters 48 and 50 also have the same transfer function $f_{1b}$. The four real filters 46, 48, 50, 52 are also cross-coupled. Therefore, the output signal 66 of real filter 50 is subtracted from the output signal 62 of real filter 46 by a summation block 78 to produce signal $S_1$ 20. Also, the output signal 64 of real filter 48 is added to the output signal 68 of real filter 52 by a summation block 80 to produce signal $S_2$ 22.

The complex filter 40 is realized, in an embodiment, by four real filters 54, 56, 58, 60. Real filters 54 and 60 have the same transfer function $f_{2a}$. Real filters 56 and 58 also have the same transfer function $f_{2b}$. The four real filters 54, 56, 58, 60 are also cross-coupled. Therefore, the output signal 74 of real filter 58 is subtracted from the output signal 70 of real filter 54 by a summation block 82 to produce signal $N_1$ 40. Also, the output signal 72 of real filter 56 is added to the output signal 76 of real filter 60 by a summation block 84 to produce signal $N_2$ 26.

The real filter transfer functions, $f_{1a}$, $f_{1b}$, $f_{2a}$ and $f_{2b}$ are linear functions.

Thus, in FIG. 9, the complex filters 38,40 are realized to produce the correct mapping for the imperfect signals $C_1$ 14 and $C_2$ 16 to produce signals $S_1$ 20, $S_2$ 22 and signals $N_1$ 24, $N_2$ 26 suitable for input signals for the adaptive filter 28 with a small and large amount of undesirable signal content, respectively.

Figure 10:
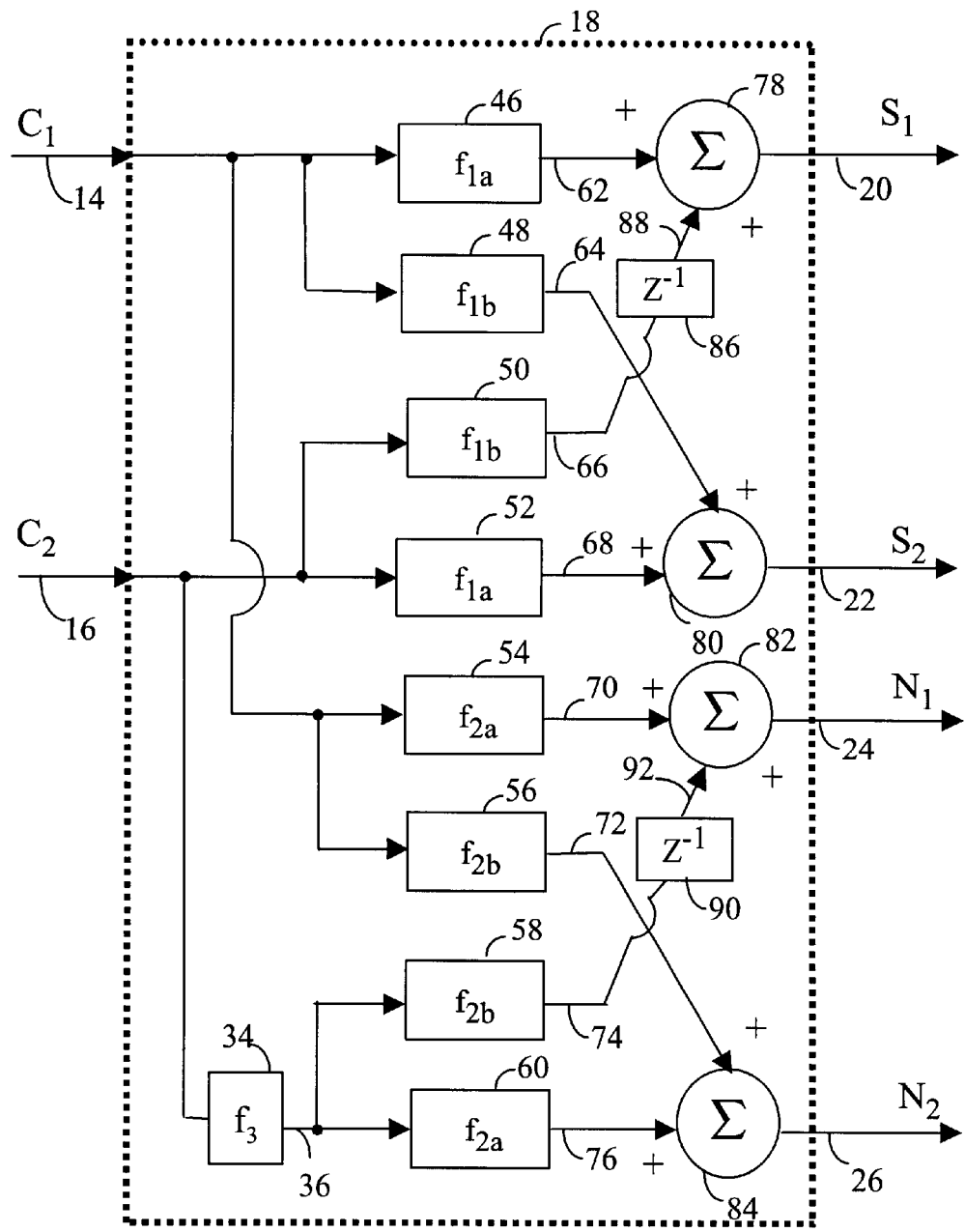
FIG. 10 illustrates an embodiment of the general mapping for the polyphase filter.

FIG. 10 illustrates the components comprising the polyphase filters 42, 44 in the double sampled mapping circuit 18 illustrated in FIG. 8. The polyphase filters are realized in a similar manner to the complex filters 38,40. The primary difference is the presence of delay elements 86 and 90. The output signal 88 of delay element 86 is added to the output of real filter 46 by summation block 78 to produce signal $S_1$ 20. This is also different from the realization of complex filter 38 where there was a subtraction of signal 66 from signal 62. Further, for polyphase filter 44, the output signal 92 of delay element 90 is added to the output of real filter 70 by summation block 82 to produce signal $N_1$ 24.

The presence of the delay element 86 is used because the sample represented by signal 66 is always ahead of the sample represented by signal 62. The presence of the delay element 90 is used because the sample represented by signal 66 is always ahead of the sample represented by signal 62.

Thus, in FIG. 10, the polyphase filters 42,44 are realized to produce the correct mapping for the imperfect signals $C_1$ 14 and $C_2$ 16 to produce signals $S_1$ 20, $S_2$ 22 and signals $N_1$ 24, $N_2$ 26 suitable for input signals for the adaptive filter 28 with a small and large amount of undesirable signal content, respectively.

Figure 11:
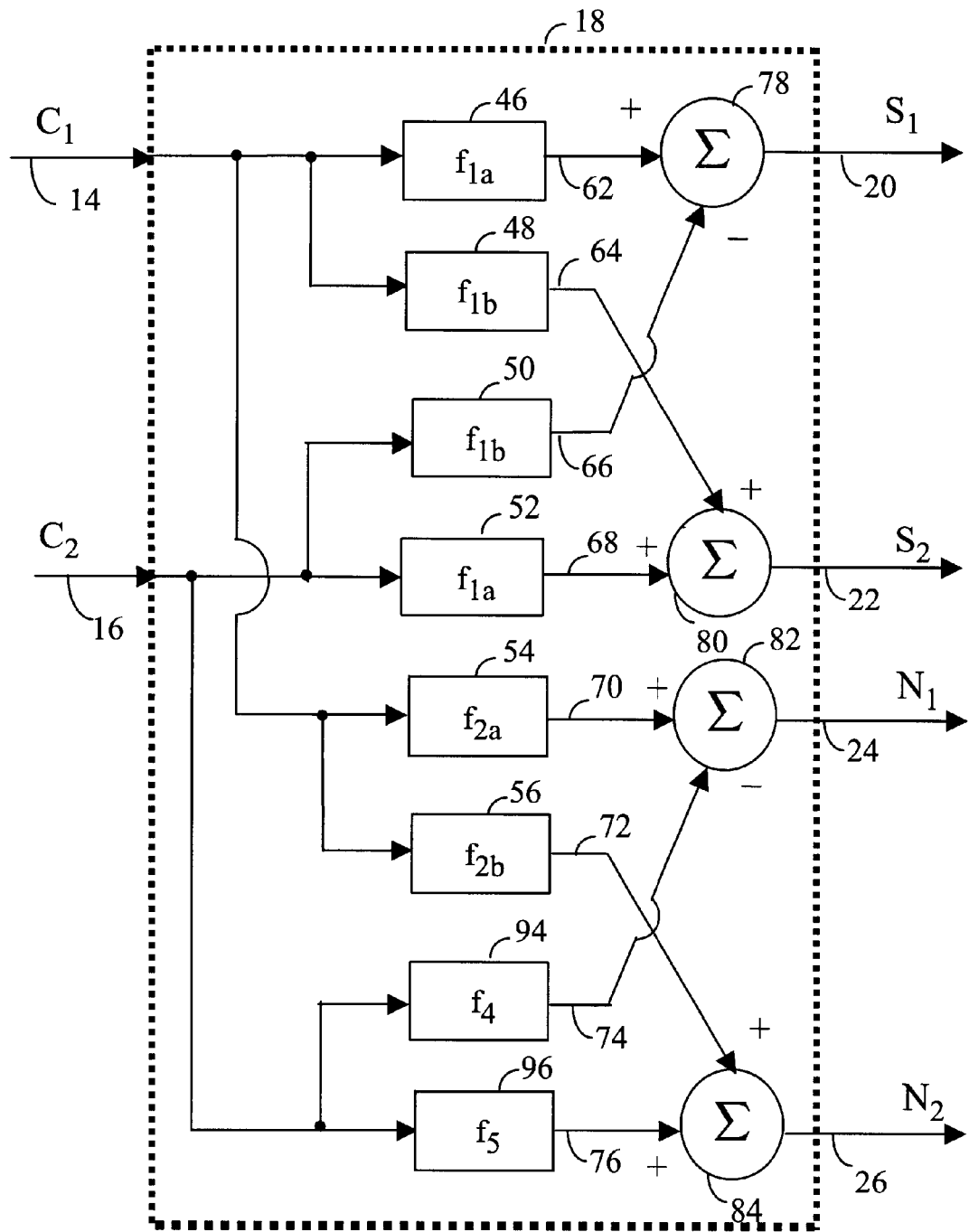
FIG. 11 illustrates an embodiment of the general mapping for the complex filter.

Another possible embodiment of the complex filters 38 and 40 for the I,Q system is illustrated in FIG. 11. In the embodiment shown in FIG. 9, function block 34 is in cascade configuration with real filter 58. Functional block 34 is also in cascade configuration with real filter 60. In the embodiment shown in FIG. 11, functional block 34 and real filter 58 are combined resulting in a real filter 94 with a different linear transfer function, $f_4$. Similarly, in the embodiment shown in FIG. 11, functional block 34 and real filter 60 are combined resulting in a real filter 96 with a different linear transfer function, $f_5$.

Thus, in FIG. 11, the complex filters 38,40 are realized to produce the correct mapping for the imperfect signals $C_1$ 14 and $C_2$ 16 to produce signals $S_1$ 20, $S_2$ 22 and signals $N_1$ 24, $N_2$ 26 suitable for input signals for the adaptive filter 28 with a small and large amount of undesirable signal content, respectively.

Figure 12:
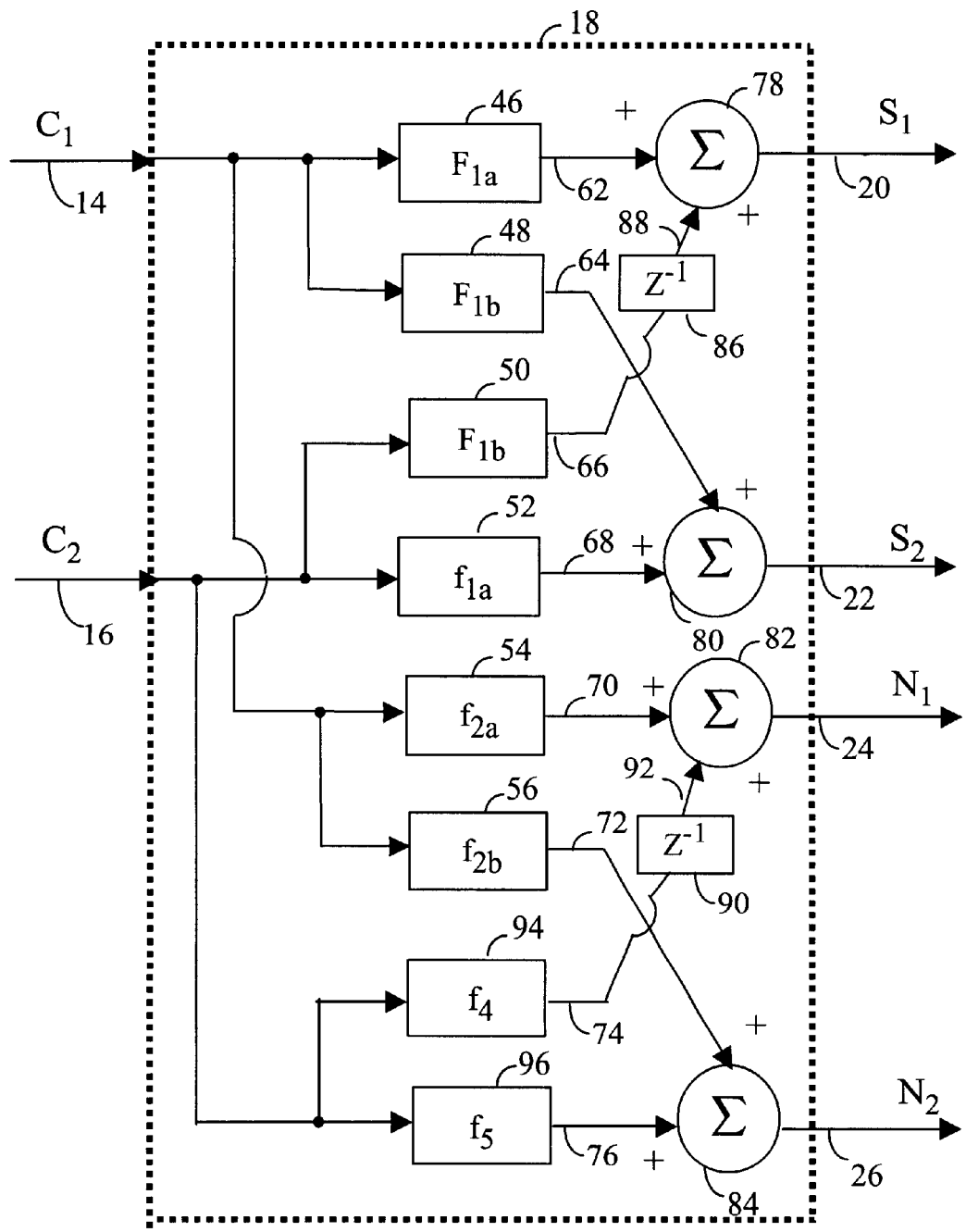
FIG. 12 illustrates an embodiment of the general mapping for the polyphase filter.

Another possible embodiment of the polyphase filters 42 and 44 for the double sampled system is illustrated in FIG. 12. In the embodiment shown in FIG. 10, function block 34 is in cascade configuration with real filter 58. Functional block 34 is also in cascade configuration with real filter 60. In the embodiment shown in FIG. 11, functional block 34 and real filter 58 are combined resulting in a real filter 94 with a different linear transfer function, $f_4$. Similarly, in the embodiment shown in FIG. 11, functional block 34 and real filter 60 are combined resulting in a real filter 96 with a different linear transfer function, $f_5$.

Thus, in FIG. 10, the polyphase filters 42,44 are realized to produce the correct mapping for the imperfect signals $C_1$ 14 and $C_2$ 16 to produce signals $S_1$ 20, $S_2$ 22 and signals $N_1$ 24, $N_2$ 26 suitable for input signals for the adaptive filter 28 with a small and large amount of undesirable signal content, respectively.

Figure 13:
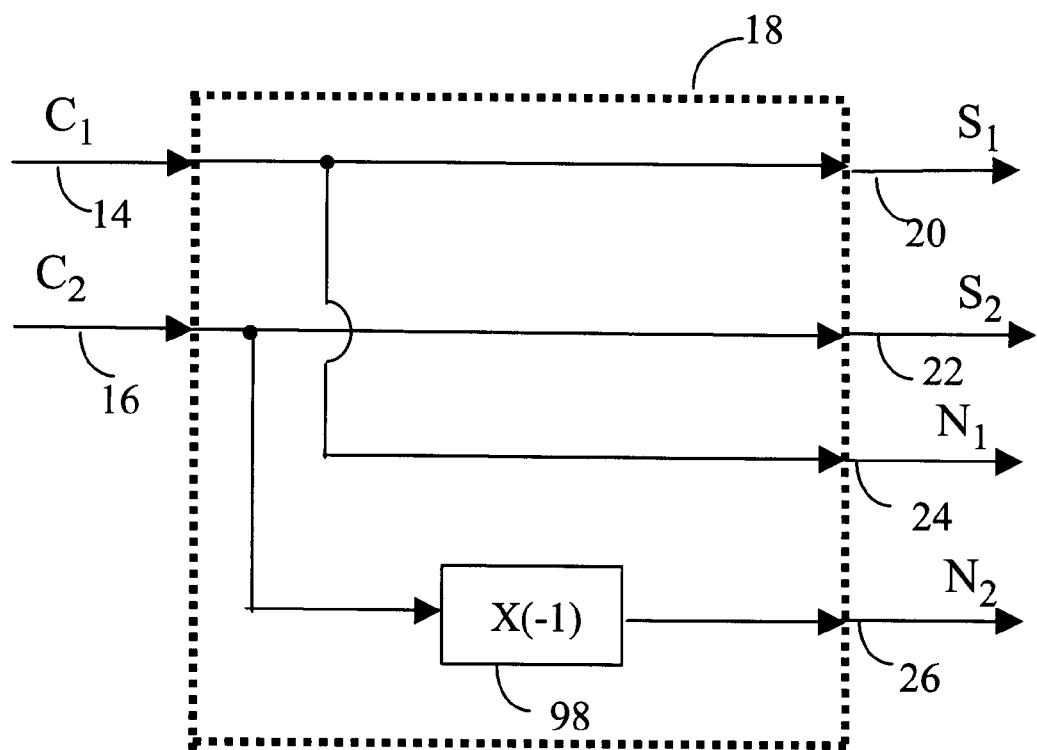
FIG. 13 illustrates the mapping circuit for the preferred embodiment.

FIG. 13 illustrates the preferred embodiment of the signal mapping circuit 18. This embodiment implements a mapping suitable for use with the adaptive filter 28 for both the I,Q system and the double sampled system.

Considering the general mapping for the I,Q system illustrated in FIG. 9, the preferred embodiment of FIG. 13 is a specific case where the transfer functions $f_{1a}$ and $f_{2a}$ for real filters 46, 52, 54 and 60 are substantially equal to the identity functions. Furthermore, the transfer functions $f_{1b}$ and $f_{2b}$ for real filters 48, 50, 56 and 58 are substantially equal to an open circuit. Thus, since the cross terms are zero, there is no need for summation blocks 78, 80, 82 and 84 in the preferred embodiment. The transfer function of function block 34 substantially equal to multiply by negative one.

Considering the general mapping for the double sampled system illustrated in FIG. 10, the preferred embodiment of FIG. 13 is a specific case where the transfer functions $f_{1a}$ and $f_{2a}$ for real filters 46, 52, 54 and 60 are substantially equal to the identity functions. Furthermore, the transfer functions $f_{1b}$ and $f_{2b}$ for real filters 48, 50, 56 and 58 are substantially equal to an open circuit. Thus, since the cross terms are zero, there is no need for summation blocks 78, 80, 82 and 84 or delay elements 86 and 90 in the preferred embodiment. The transfer function of function block 34 substantially equal to multiply by negative one.

Therefore in both the I,Q system and double sampled systems, the general embodiments of the signal mapping circuit 18, illustrated in FIGS. 9 and 10, reduce to the same preferred embodiment of the signal mapping circuit 18 illustrated in FIG. 13.

Thus, the signal mapping circuit 18 in FIG. 13 provides the correct mapping for the imperfect signals $C_1$ 14 and $C_2$ 16 to produce signals $S_1$ 20, $S_2$ 22 and signals $N_1$ 24, $N_2$ 26 suitable for input signals for the adaptive filter 28 with a small and large amount of undesirable signal content, respectively.

Turning now to the adaptive filter 28 shown in FIG. 6, the preferred embodiment of the invention uses a type of adaptive filter known as a noise canceller. Noise cancellers are well known in the art of adaptive filters, and therefore are not described in detail herein.

Figure 14:
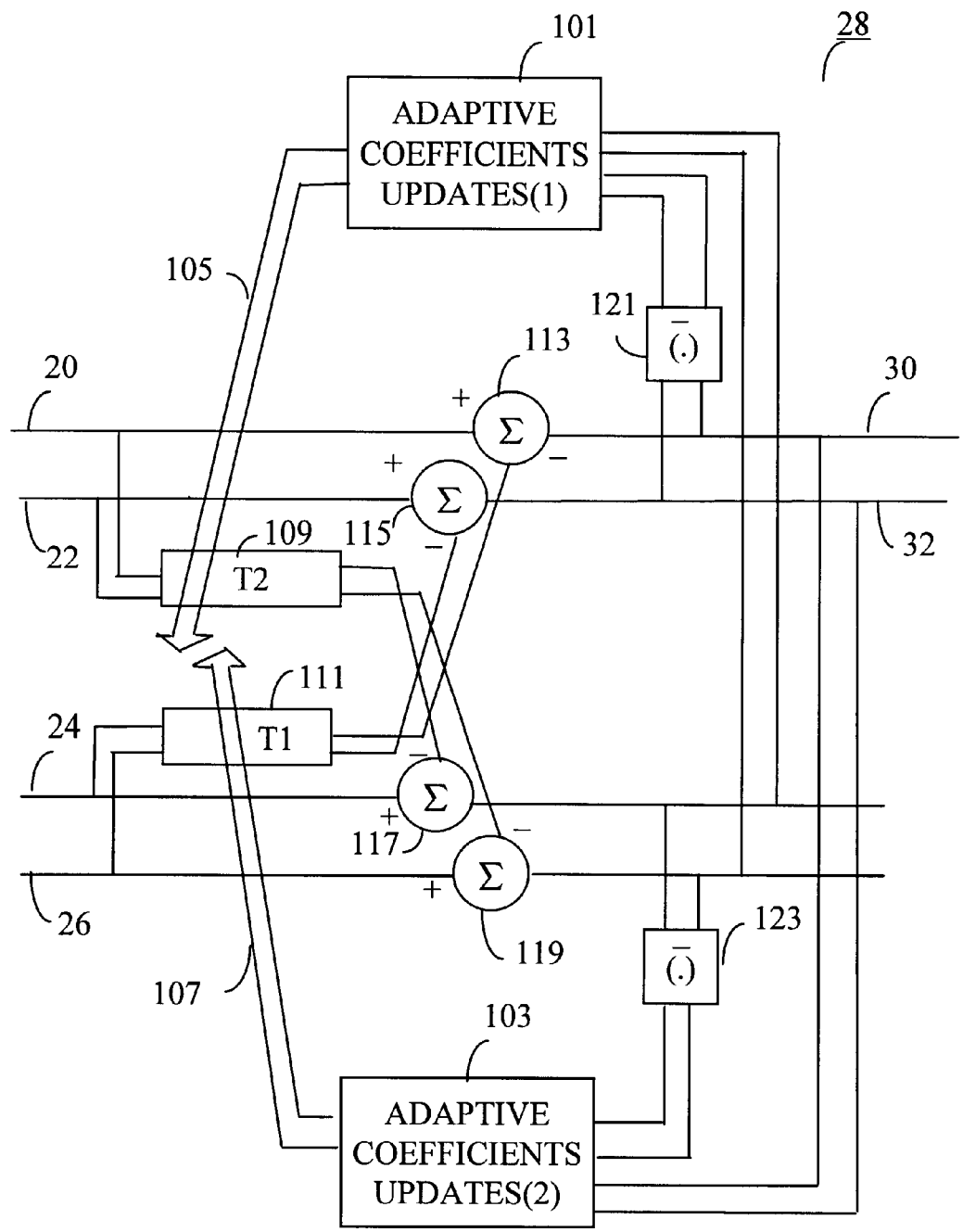
FIG. 14 illustrates a N-th order noise canceller.

A N-th order noise canceller 28 is shown in FIG. 14, with input signals 20, 22, 24 and 26 and output signals 30 and 32. Elements 113, 115, 117 and 119 are summers. Elements 121 and 123 are complex conjugate operators, which often is implemented by multiplying one of the components by negative one. Elements 109 and 111 are finite impulse response (FIR) filters as are well known in the art. Other forms of filters 109 and 111 are possible, such as, recursive, cascade, transposed, and other types well known in the art. Elements 101 and 103 provide the adaptive coefficient updates for filters 109 and 111. Any adaptive algorithm can be used, however often descent algorithms as are known in the art are preferred. The preferred embodiment of the invention uses least mean squares (LMS) for the adaptive coefficients updates, however other algorithms such as gear-shifted LMS, or FRLS could be used. Adaptive coefficient updates 101 and 103 produce coefficient vector signals 105 and 107 which control the response of the filters 109 and 111. The coefficient vector signals 105 and 107 are each N pairs of coefficients, hence the noise canceller is of order N. A filter in the signal path within the adaptive filter 28 to block direct current may be useful.

Although many noise cancellers as are known in the art can be used, the preferred embodiment uses a zero order noise canceller with LMS because it is the most simple implementation.

Figure 15:
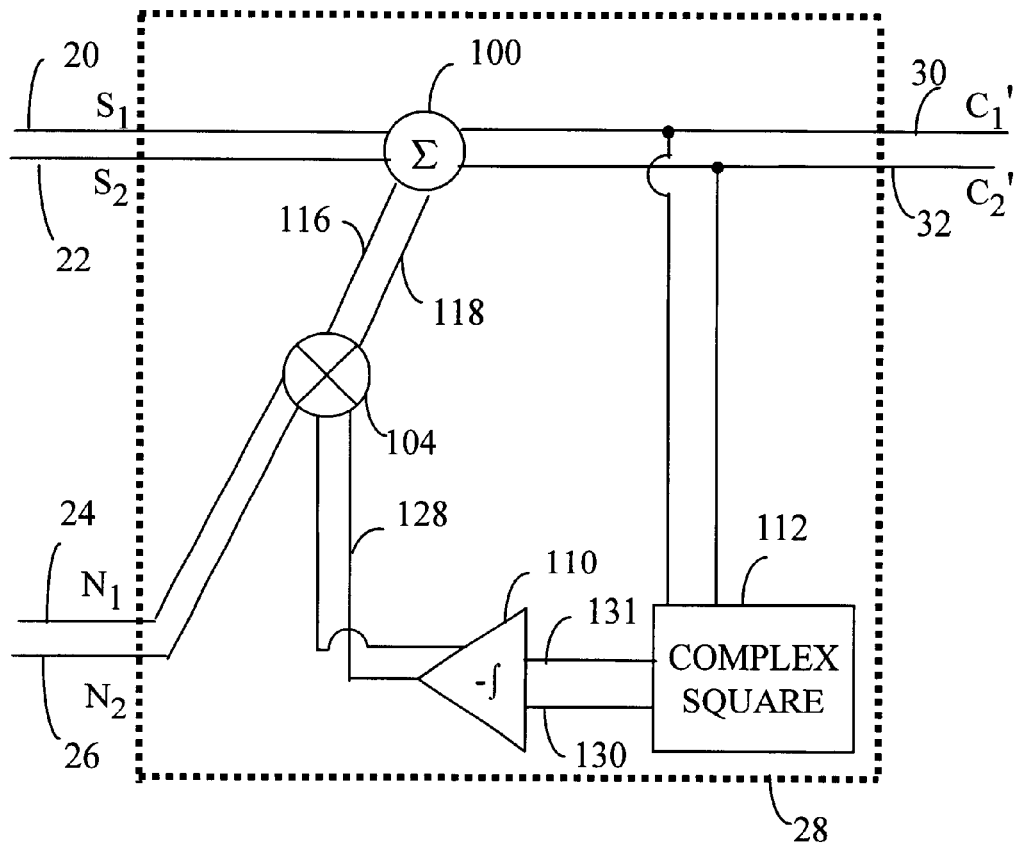
FIG. 15 illustrates the adaptive filter realized as a noise canceller for the I,Q system.

A zero order noise canceller used in preferred embodiment of the invention for the I,Q system is illustrated in FIG. 15. Inputs to the zero order noise canceller 28 are signals 20, 22, 24 and 26. The zero order noise canceller 28 produces output signals 30 and 32. Element 100 is a summer and element 104 is a complex multiplier. Element 110 is a integration function and element 112 is a complex square function. Taken together, elements 110 and 112 implement the LMS in the zero order noise canceller 28. Further the integration function 110 has a negative gain, however the negative gain could be placed elsewhere and be mathematically equivalent. The integration function 110 is in general a complex integration to model the phase and gain errors, however a real integration is usually sufficient for gain errors only.

Figure 16:
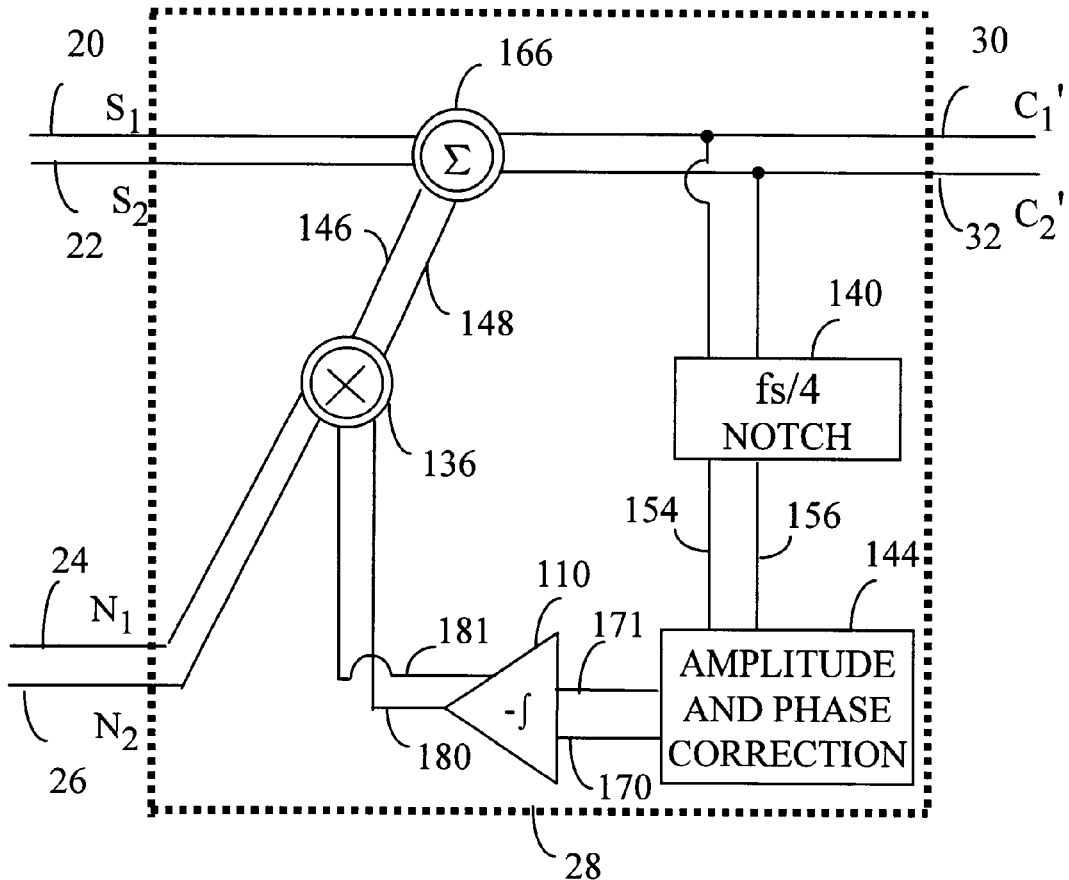
FIG. 16 illustrates a noise canceller for the double sampled system.

In the case of the double sampled system, the preferred embodiment of the noise canceller 28 is illustrated in FIG. 16. Noise canceller 28 is zero order, a specific case of the general adaptive filter shown in FIG. 14. Inputs to the noise canceller 28 are signals 20, 22, 24 and 26, with signals 20 and 24 called the even inputs and signals 22 and 26 called the odd inputs. The noise canceller 28 produces output signals 30 and 32. Elements 110 and 144 implement the LMS algorithm as described previously, except that element 144 is an amplitude and phase correction element. Element 144 produces output signal 171 that is substantially equal to the power difference of signals 154 and 156. Element 144 also produces output signal 170 which is a correlation of one of signals 154 and 156 with a derivative of the other of signals 154 and 156. Integration element 110 is a biphase integrator that integrates even inputs to get even outputs and integrates odd inputs to get odd outputs. Summer 166 is also a biphase operator that adds even inputs to given even outputs and that add odd inputs to give odd outputs. Element 140 is a biphase notch filter that removes the input component at $f_s/4$. Finally, element 136 is a biphase multiplier.

Figure 17:
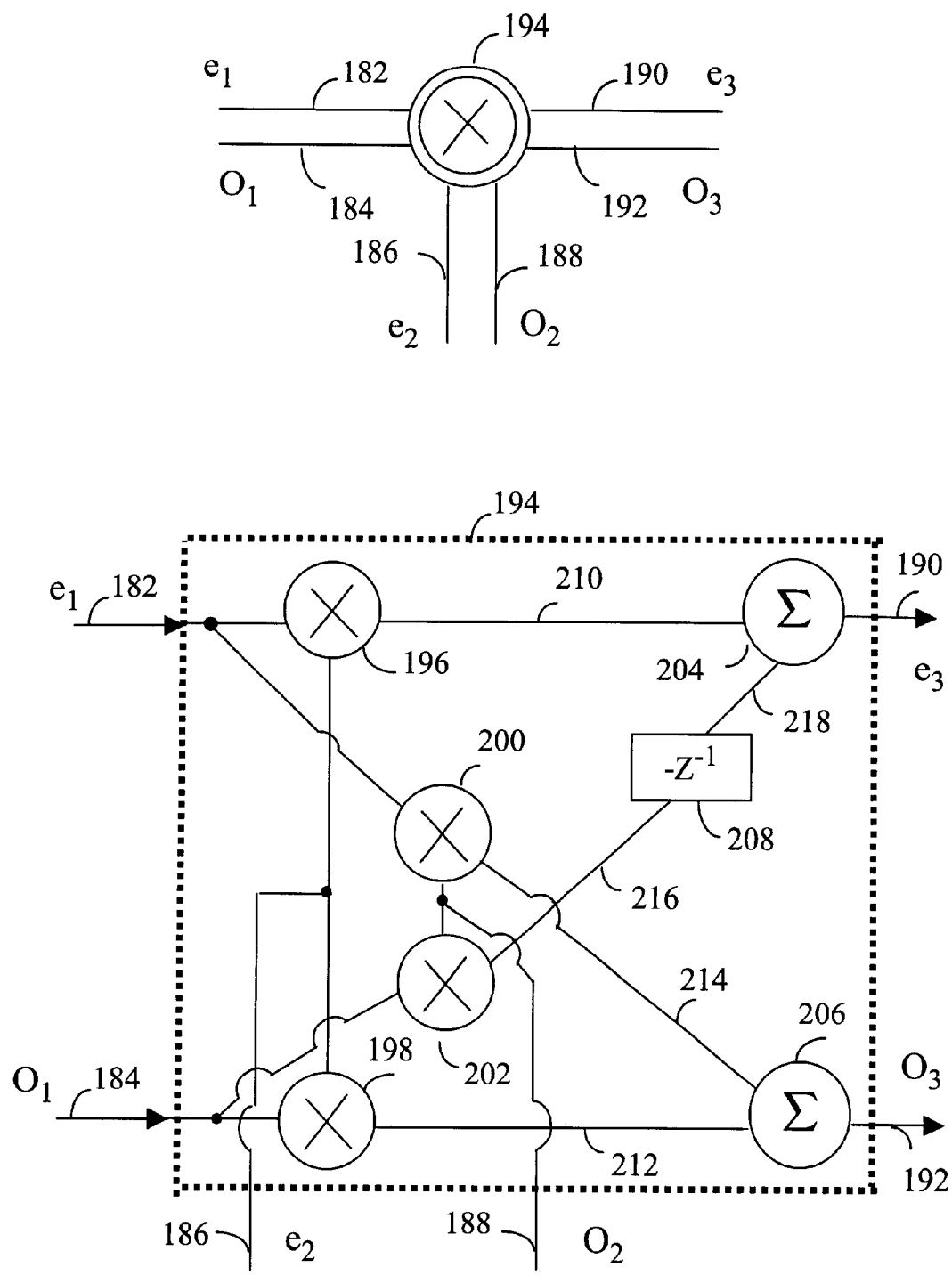
FIG. 17 illustrates a biphase multipliers for the noise canceller used in the double sampled system.

FIG. 17 illustrated a configuration of a biphase multiplier. The input signals are 182, 184, 186 and 188. The output signals are 190 and 192. Signals 182, 186 and 190 are called even signals. Signals 184, 188 and 193 are called odd signales. Elements 196, 198, 200 and 202 are multipliers. Elements 204 and 206 are summers, and element 208 is a delay block multiplied by negative one.

Figure 18:
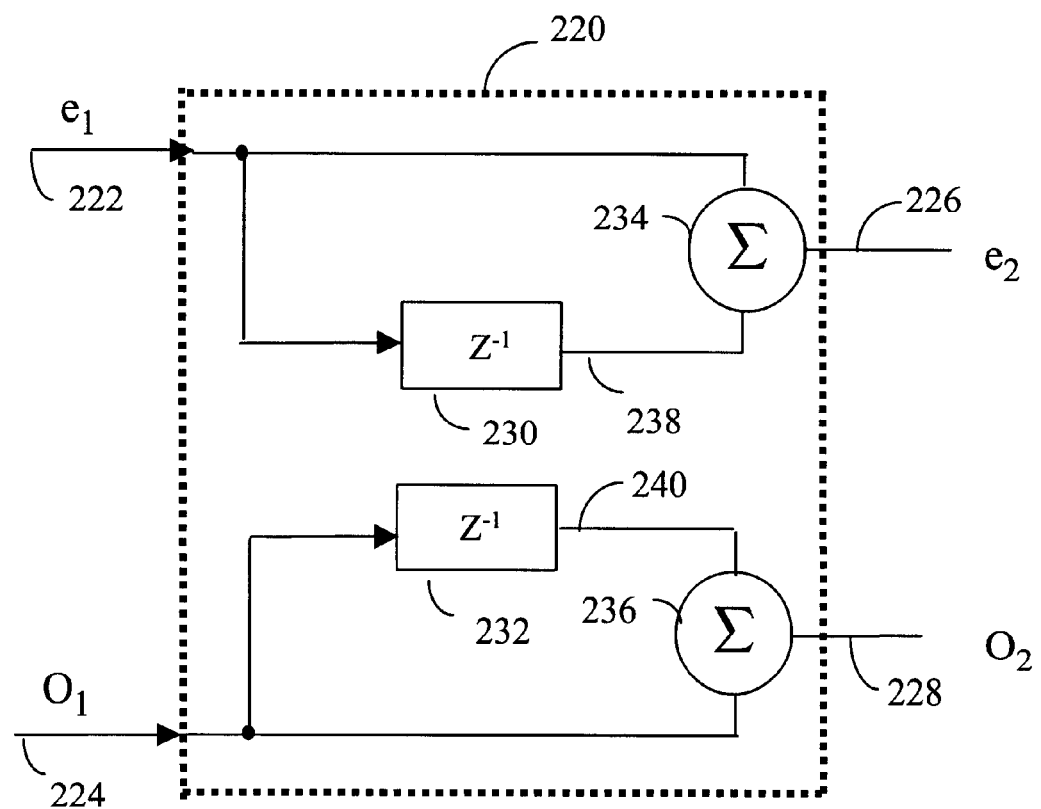
FIG. 18 illustrates a biphase notch filter for the noise canceller used in the double sampled system.

The biphase notch filter is illustrated in FIG. 18. Signals 222 and 224 are the input signals and signals 226 and 228 are the output signals. Signals 222 and 226 are called even signals. Signals 224 and 228 are called odd signals. Elements 230 and 232 are delay blocks and elements 234 and 236 are summers.

Figure 19:
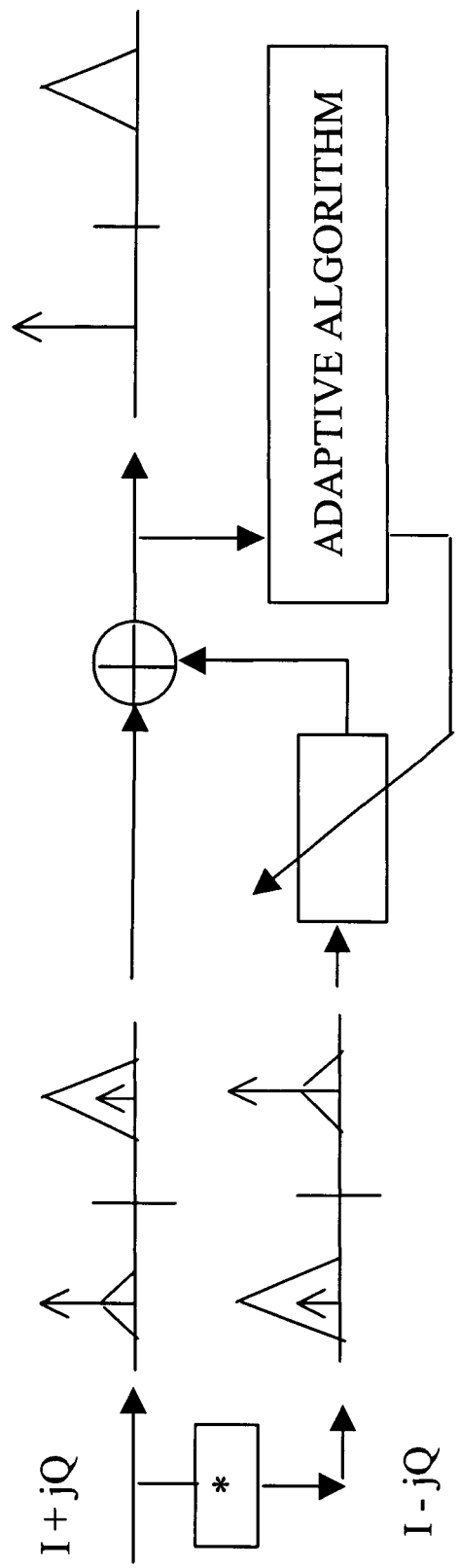
FIG. 19 illustrates the principle of the preferred embodiment for the I,Q system.

Using the preferred embodiments of the signal mapping circuit 18 and the noise canceller 28 described above, FIG. 19 conceptually illustrates the principles of the preferred embodiment of the invention for the I,Q systems. The I and Q signal's conjugate is taken and run through an adaptive noise cancelling filter and subtracting the result from the original signal. In the preferred embodiment the particular adaptive filter technique used is a LMS algorithm. The number of taps in the adaptive filter typically required is small, usually one or two, making the technique practical.

Figure 20:
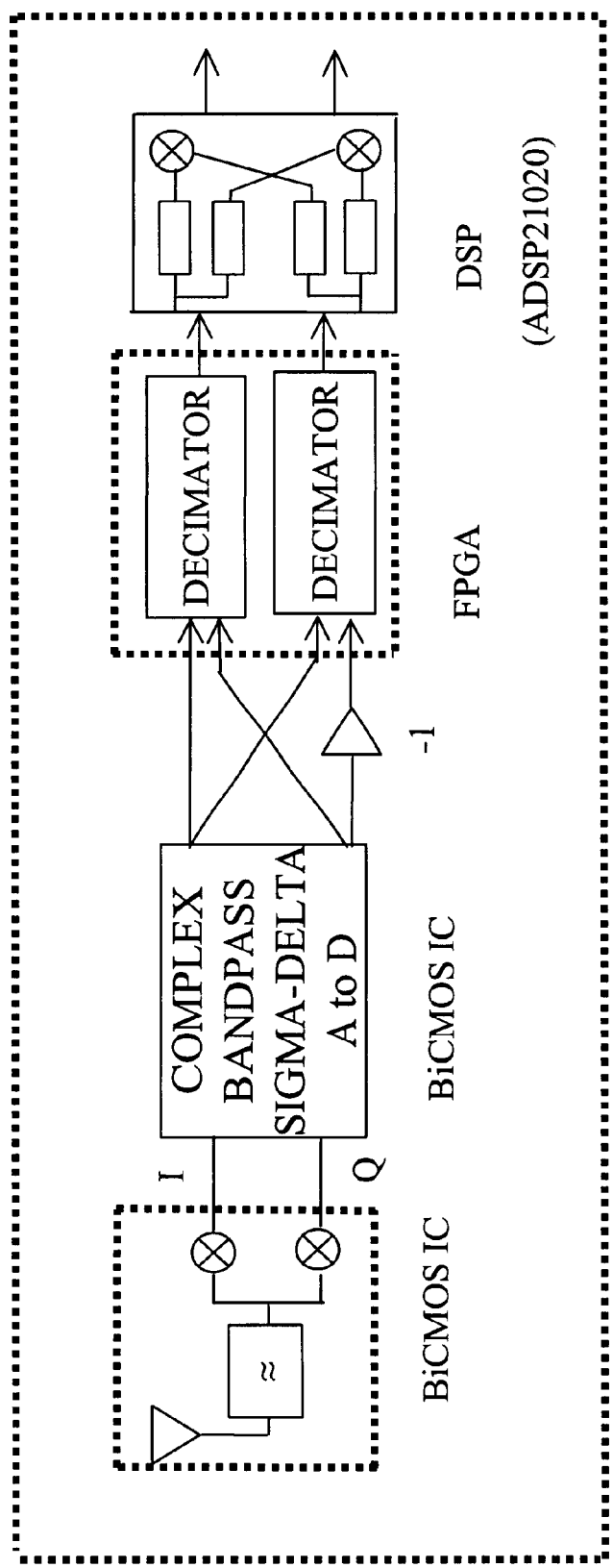
FIG. 20 illustrates an implementation of the preferred embodiment for the I,Q system.

The preferred embodiment of the invention is implemented as shown in FIG. 20 and combines several existing analog integrated circuits and performs the adaptive filtering in a standard Digital Signal Processor and the required decimation in a Field Programmable Logic Array (FPGA). This preferred embodiment implementation is a proof of concept version. This invention is not restricted to this implementation and can be easily integrated into any signal processing engine or mechanism anywhere inside an overall I,Q system. In fact, commercial products optimize system partitioning to maximize integration.

In RF receivers using oversampled analog to digital converters in the I,Q path, this invention is effective at a decimated sample rate thus simplifying implementation and removing the large quantization noise that would normally need to be handled by the adaptive filters.

In architectures that use the analog to digital converters to perform the complex filtering, such as bandpass sigma delta modulators, this invention corrects for transfer function inaccuracies due to mismatch between the analog to digital converters themselves. Since complex Bandpass oversampled modulators are particularly sensitive to mismatch, this ability to compensate significantly improves performance. Even small mismatches cause significant degradation. For example, a 1% mismatch can degrade performance by as much as 35 dB. The preferred embodiment of this invention has been demonstrated to recover up to 20 dB of that loss.

Figure 1A:
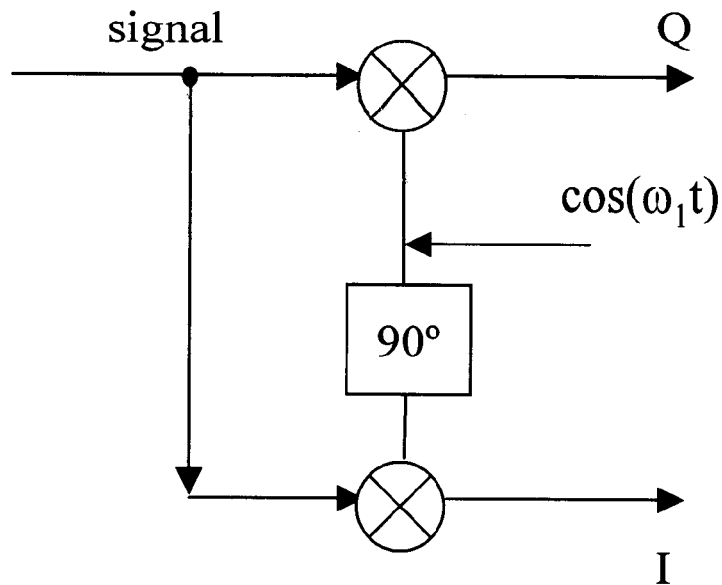
FIG. 1 illustrates I,Q systems.
Figure 1B:
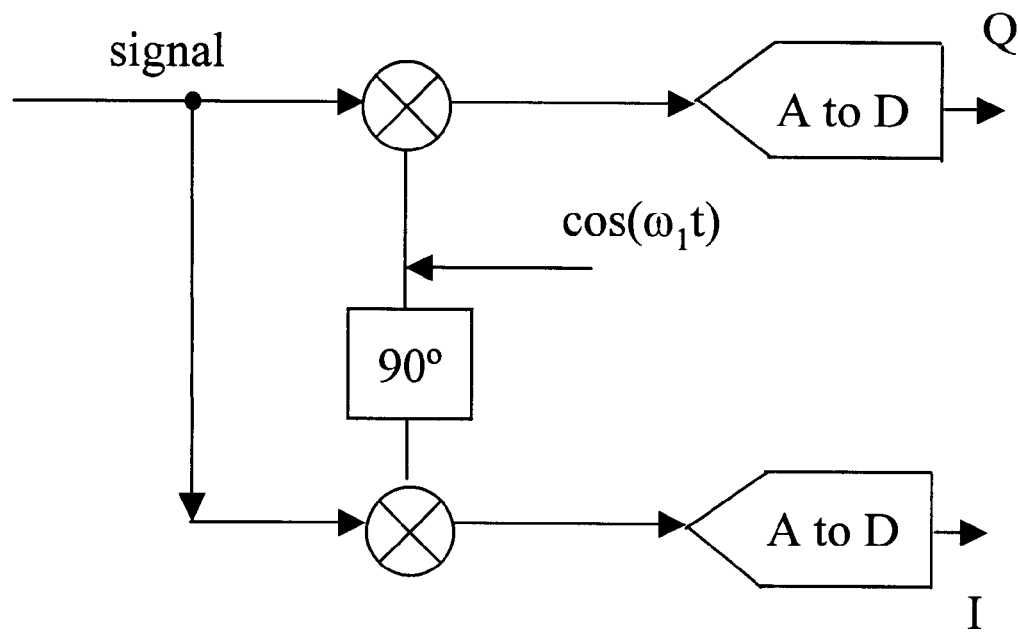
Figure 1C:
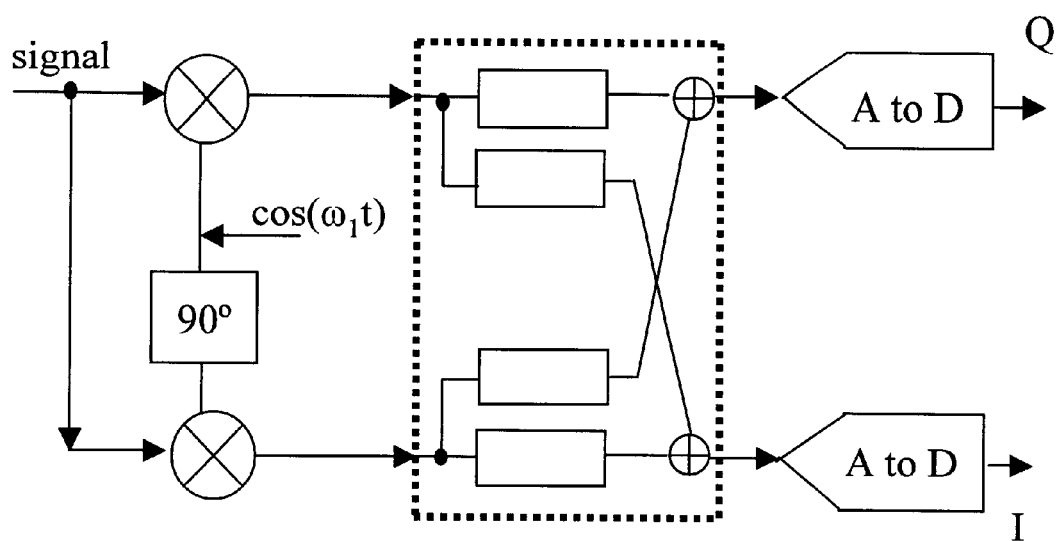
Figure 2A:
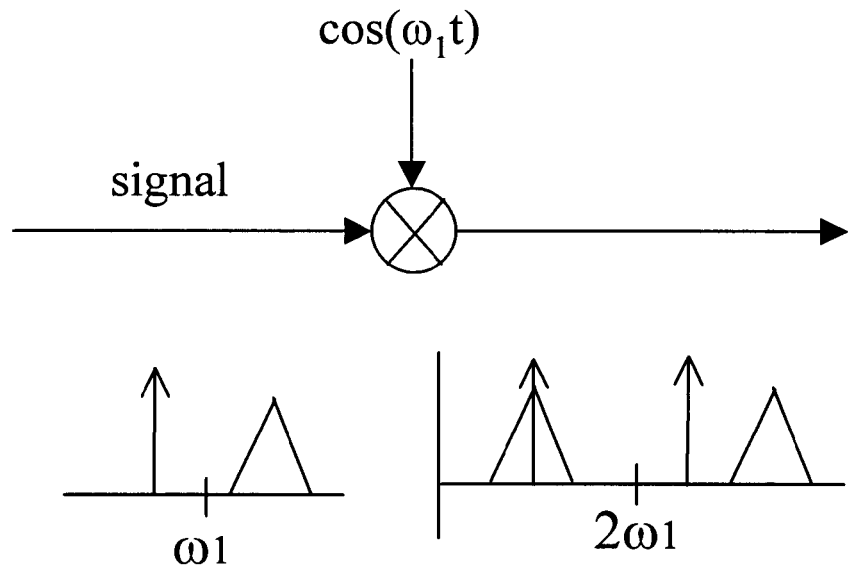
FIG. 2 illustrates unwanted image spectra in I,Q systems.
Figure 2B:
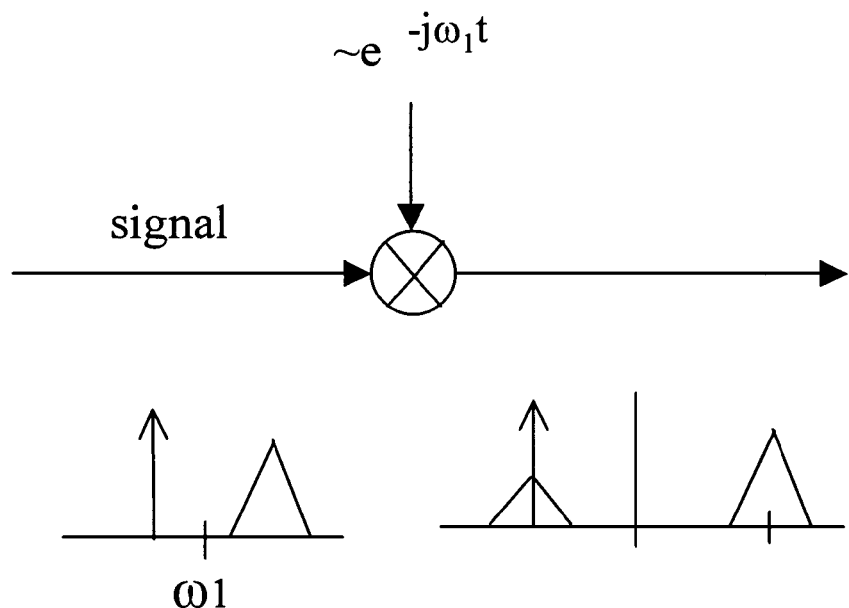
Figure 3:
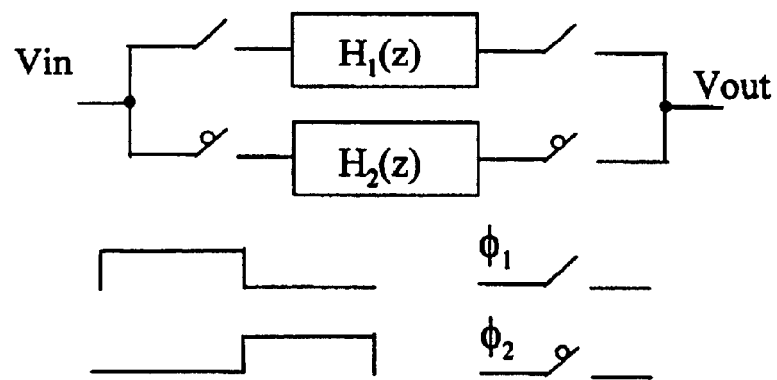
FIG. 3 illustrates a double sampling circuit model.
Figure 21:
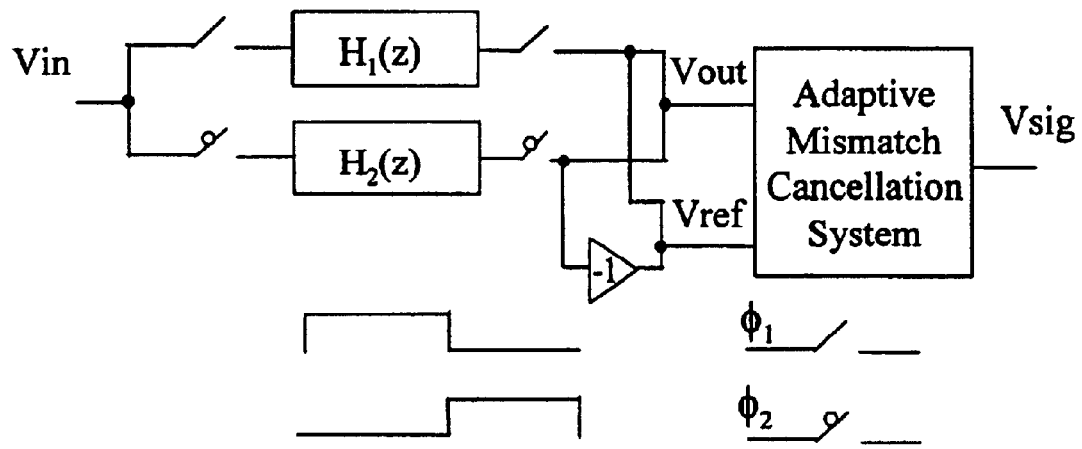
FIG. 21 illustrates an implementation of the preferred embodiment for the double sampled system.
Figure 4:
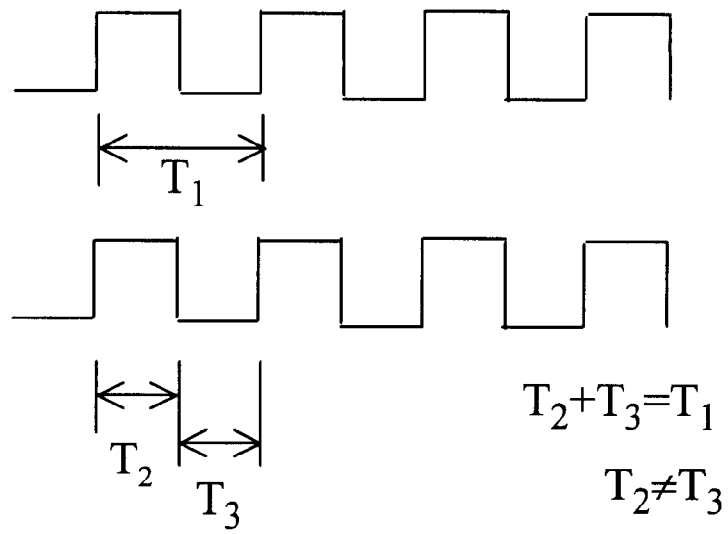
FIG. 4 illustrates clocks in a double sampled circuit.
Figure 5:
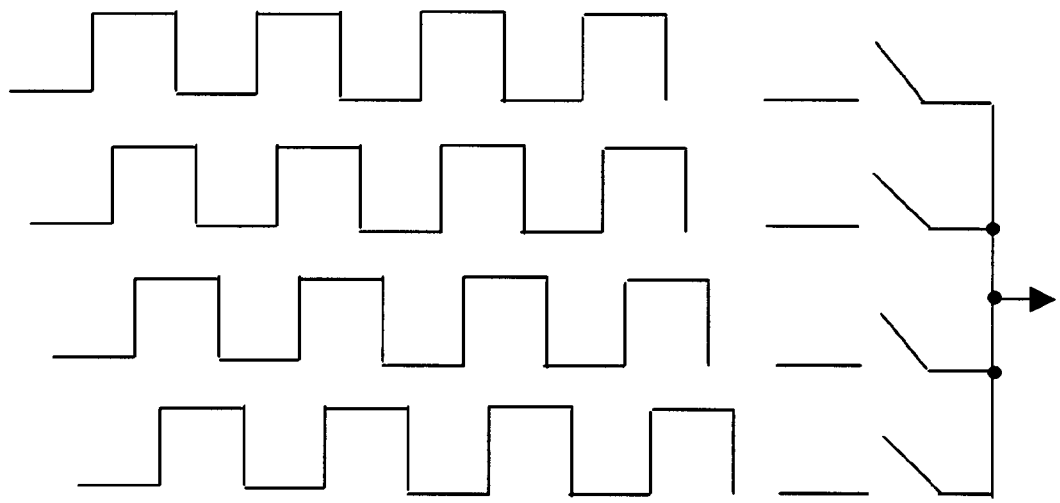
FIG. 5 illustrates clocks in a N-path filter.

The preferred embodiment of the signal processor in a double sampled system is shown in FIG. 21. The preferred of the embodiment of the signal mapping circuit is substantially the same for the double sampled system as for the I,Q system.

The preferred embodiment of the invention uses a feedforward configuration. The feedforward configuration reduces the undesirable signal content in a signal resulting in a new signal of higher quality. Another embodiment of the invention may use an adaptive filter and associated signal mapping circuit in a feedback configuration. In a feedback configuration the adaptive filter and associated signal mapping can be used to reduce the undesirable signal content in the output signal from the analog circuit itself.

A further embodiment of the invention can incorporate the signal mapping circuit into the adaptive filter circuitry.

A further embodiment of the invention is the double sampled system can use the same implementation as in the I,Q system except use the even samples as the input in place of the inphase channel and the odd samples as the input in place of the quadrature channel.

Numerous modifications, variations and adaptations may be made to the particular embodiments of the invention described above without departing from the scope of the invention, which is defined in the claims.

We claim:

1. A signal processor for reducing undesirable signal content in an I,Q signal produced by an analog circuit having imperfections, the signal processor comprising:
   a mapping module including first and second complex filters, each of which is responsive to at least one signal from the analog circuit, the first complex filter producing a first output signal with a first amount of the undesirable signal content, the second complex filter producing a second output signal with a second amount of the undesirable signal content; and
   an adaptive filter including a noise canceller responsive to at least one of the first and second output signals from the mapping module and producing a signal with reduced undesirable signal content.

2. A signal processor as recited in claim 1, wherein []each of the complex filters is responsive to a first and a second input signal; []each of the complex filters comprising:
   a first, a second, a third and a fourth real filter; and
   a first and a second summation element,
   the first and fourth filters having a first linear transfer function;
   the second and third filter s having a second linear transfer function;
   the transfer functions being real functions;
   the first and second real filters being responsive to the first input signal;
   the third and fourth real filters being responsive to the second input signal;
   the first real filter producing a first real filter output signal;
   the second real filter producing a second real filter output signal;
   the third real filter producing a third real filter output signal;
   the fourth real filter producing a fourth real filter output signal;
   the first summation element being responsive to the first real filter output signal and the third real filter output signal;
   the second summation element being responsive to the second real filter output signal and the fourth real filter output signal;
   the first summation element producing the first output signal wherein:
      the first output signal is substantially equal to the third real filter output signal subtracted from the first real filter output signal;
   the second summation element producing the second output signal wherein:
      the second output signal is substantially equal to the second real filter output signal added to the fourth real filter output signal; and
   at least one input signal being at least one signal from the analog circuit previously modified by a third linear function.

3. A signal processor as recited in claim 1, wherein []each of the complex filters is responsive to a first and a second input signal; []each of the complex filters comprising:
   a first, a second, a third and a fourth real filter; and
   a first and a second summation element,
   the filters each having a different linear transfer function;
   the first and second real filters being responsive to the first input signal;
   the third and fourth real filters being responsive to the second input signal;
   the first real filter producing a first real filter output signal;
   the second real filter producing a second real filter output signal;
   the third real filter producing a third real filter output signal;
   the fourth real filter producing a fourth real filter output signal;
   the first summation element being responsive to the first real filter output signal and the third real filter output signal;
   the second summation element being responsive to the second real filter output signal and the fourth real filter output signal;
   the first summation element producing the first output signal wherein:
      the first output signal is substantially equal to the third real filter output signal subtracted from the first real filter output signal;
   the second summation element producing the second output signal wherein:
      the second output signal is substantially equal to the second real filter output signal added to the fourth real filter output signal; and
   the first complex filter having the first, the second, the third and the fourth linear functions being substantially different and the second complex filter having the first and fourth filters having a first linear transfer function and the second and third filters having a second linear transfer function.

4. A signal processor as recited in claim 1, wherein
   (a) the noise canceller uses a least means squares algorithm.

5. A signal processor as recited in claim 1, wherein
   (a) the noise canceller is a zero order noise canceller.

6. A signal processor as recited in claim 1, wherein
   (a) the noise canceller uses a least means squares algorithm; and
   (b) the noise canceller is a zero order noise canceller.

7. A signal processor for reducing undesirable signal content in a double sampled signal produced by a least one analog sample and hold circuit having imperfections, the signal processor comprising:

a mapping module including first and second polyphase filters, each of which is responsive to at least one signal from the analog circuit, the first polyphase filter producing a first output signal with a first amount of the undesirable signal content, the second polyphase filter producing a second output signal with a second amount of the undesirable signal content; and an adaptive filter including a noise canceller responsive to at least one of the first and second output signals from the mapping module and producing a signal with reduced undesirable signal content.

8. A signal processor as recited in claim 7, wherein each of the polyphase filters is responsive to a first and a second input signal;

each of the polyphase filters comprising:
a first, a second, a third and a fourth real filter;
a first and a second summation element; and
a delay element, the first and fourth filters having a first linear transfer function;

the second and third filters having a second linear transfer function;

the transfer functions being real functions;

the first and second real filters being responsive to the first input signal;

the third and fourth real filters being responsive to the second input signal;

the first real filter producing a first real filter output signal;

the second real filter producing a second real filter output signal;

the third real filter producing a third real filter output signal; and the fourth real filter producing a fourth real filter output signal;

the delay element responsive to the third real filter output signal and producing a delayed third real filter output signal, the first summation element being responsive to the first real filter output signal and the delayed third real filter output signal;

the second summation element being responsive to the second real filter output signal and the fourth real filter output signal;

the first summation element producing the first output signal wherein:
the first output signal is substantially equal to the delayed third real filter output signal added to the first real filter output signal;

the second summation element producing the second output signal wherein:
the second output signal is substantially equal to the second real filter output signal added to the fourth real filter output signal; and at least one input signal being at least one signal from the analog circuit previously modified by a third linear function.

9. A signal processor as recited in claim 7, wherein each of the polyphase filters is responsive to a first and a second input signal;

each of the polyphase filters comprising:
a first, a second, a third and a fourth real filter;
a first and a second summation element; and
a delay element, the filters each having a different linear transfer function;

the transfer functions being real functions;

the first and second real filters being responsive to the first input signal;

the third and fourth real filters being responsive to the second input signal;

the first real filter producing a first real filter output signal;

the second real filter producing a second real filter output signal;

the third real filter producing a third real filter output signal; and the fourth real filter producing a fourth real filter output signal;

the delay element responsive to the third real filter output signal and producing a delayed third real filter output signal;

the first summation element being responsive to the first real filter output signal and the delayed third real filter output signal;

the second summation element being responsive to the second real filter output signal and the fourth real filter output signal;

the first summation element producing the first output signal wherein:
the first output signal is substantially equal to the delayed third real filter output signal added to the first real filter output signal;

the second summation element producing the second output signal wherein:
the second output signal is substantially equal to the second real filter output signal added to the fourth real filter output signal; and the first polyphase filter having the first, the second, the third and the fourth linear functions being substantially different and the second polyphase filter having the first and fourth filters having a first linear transfer function and the second and third filters having a second linear transfer function.

10. A signal processor as recited in claim 7, wherein
(a) the noise canceller uses a least means squares algorithm.

11. A signal processor as recited in claim 7, wherein
(a) the noise canceller is a zero order noise canceller.

12. A signal processor as recited in claim 7, wherein
(a) the noise canceller uses a least means squares algorithm; and
(b) the noise canceller is a zero order noise canceller.

13. A signal processor for reducing undesirable signal content caused by gain mismatches or phase mismatches, or both, in a signal produced by an analog circuit having imperfections, the signal processor comprising:

a signal mapping module for mapping the signal to provide a plurality of output signals such that each of the output signals has the undesirable signal content and the amount of the undesirable signal content of at least one of the output signals is different from that of another of the output signals; and an adaptive filter module for processing the output signals from the signal mapping module to reduce the undesirable signal content, wherein the signal from the analog circuit has at least two constituent signals;

said signal mapping module includes a signal mapping circuit;

said adaptive filter module includes a noise canceller;

the signal mapping circuit is responsive to at least one signal from the analog circuit;

the signal mapping circuit produces at least one of the output signals, which is substantially the same as the signal from the analog circuit;

the noise canceller uses a least means squares algorithm;

the noise canceller is a zero order noise canceller.

14. A signal processor for reducing undesirable signal content in a signal produced by an analog circuit having imperfections, the signal processor comprising:

a signal mapping module for mapping the signal to provide a plurality of output signals such that each of the output signals has the undesirable signal content and the amount of the undesirable signal content of at least one of the output signals is different from that of another of the output signals; and an adaptive filter module for processing the output signals from the signal mapping module to reduce the undesirable signal content, wherein the signal from the analog circuit includes first and second constituent analog circuit signals;

the output signals from the signal mapping module include a first output signal with first and second constituent undesirable content signals and a second output signal with first and second constituent undesirable content signals;

the first constituent undesirable content signal is substantially equal to the first constituent analog circuit signal; and the second constituent undesirable content signal of the second output signal is substantially equal to the second constituent analog circuit signal multiplied by negative one.

15. For reducing undesirable signal content caused by gain mismatches or phase mismatches, or both, in a signal produced by an analog circuit having imperfections, the signal processor comprising:

a signal mapping module for mapping the signal to provide a plurality of output signals such that each of the output signals has the undesirable signal content and the amount of the undesirable signal content of at least one of the output signals is different from that of another of the output signals; and an adaptive filter module for processing the output signals from the signal mapping module to reduce the undesirable signal content, wherein the signal from the analog circuit has at least two constituent signals;

said adaptive filter module includes a noise canceller;

the signal mapping module includes a signal mapping circuit which is responsive to at least one signal from the analog circuit;

the signal mapping circuit produces at least one of the output signals, which is substantially the same as the signal from the analog circuit;

the noise canceller uses a least means squares algorithm;

the noise canceller is a zero order noise canceller;

the signal from the analog circuit includes first and second constituent analog circuit signals;

the output signals from the signal mapping module include a first output signal with first and second constituent undesirable content signals and a second output signal with first and second constituent undesirable content signals;

the first constituent undesirable content signal is substantially equal to the first constituent analog circuit signal; and the second constituent undesirable content signal of the second output signal is substantially equal to the second constituent analog circuit signal multiplied by negative one.

16. A signal processor for reducing undesirable signal content in a signal produced by an analog circuit having imperfections, the signal processor comprising:

a signal mapping module for mapping the signal to provide a plurality of output signals such that each of the output signals has the undesirable signal content and the amount of the undesirable signal content of at least one of the output signals is different from that of another of the output signals; and an adaptive filter module for processing the output signals from the signal mapping module to reduce the undesirable signal content, said mapping module produces a first output signal with a small amount of the undesirable signal content and a second output signal with a large amount of the undesirable signal content.

* * * * *

UNITED STATES PATENT AND TRADEMARK OFFICE
CERTIFICATE OF CORRECTION

PATENT NO. : 6,804,359 B1
DATED : October 12, 2004
INVENTOR(S) : Li Yu et al.

It is certified that error appears in the above-identified patent and that said Letters Patent is hereby corrected as shown below:

<u>Title page,</u>
Item [73], Assignee, change "Woburn, MA (US)" to -- Irvine, CA (US) --

Signed and Sealed this

Twelfth Day of April, 2005

JON W. DUDAS
*Director of the United States Patent and Trademark Office*